United States Patent [19]  [11] Patent Number: 4,950,901
Jones et al.  [45] Date of Patent: Aug. 21, 1990

[54] SPECIMEN COOLING HOLDER FOR SIDE ENTRY TRANSMISSION ELECTRON MICROSCOPES

[75] Inventors: Joseph S. Jones, Pleasanton; Peter R. Swann, Diablo, both of Calif.

[73] Assignee: Gatan, Incorporated, Pleasanton, Calif.

[21] Appl. No.: 432,229

[22] Filed: Nov. 6, 1989

[51] Int. Cl.⁵ ............................................. H01V 37/20
[52] U.S. Cl. ................................. 250/443.1; 62/51.1
[58] Field of Search .................. 250/443.1, 440.1, 311; 62/51.1

[56] References Cited

U.S. PATENT DOCUMENTS

| 4,262,194 | 4/1981 | Hayward | 250/440.1 |
| 4,833,330 | 5/1989 | Swann et al. | 250/443.1 |
| 4,869,068 | 9/1989 | Van Vloten | 62/51.1 |
| 4,870,830 | 10/1989 | Hohenwarter et al. | 62/51.1 |

Primary Examiner—Jack I. Berman

[57] ABSTRACT

An improved specimen cooling holder for transmission electron microscopy is described. Low thermal conductivity pins near the specimen and an improved conductor/dewar connection reduce specimen vibration, providing improved image resolution. Multiple heaters facilitate accurate temperature control and bakeout procedures.

6 Claims, 3 Drawing Sheets

SPECIMEN COOLING HOLDER FOR SIDE ENTRY TRANSMISSION ELECTRON MICROSCOPES

BACKGROUND—FIELD OF INVENTION

The invention relates to specimen holders for transmission electron microscopes and particularly to side entry specimen cooling holders.

BACKGROUND—DESCRIPTION OF PRIOR ART

There are many advantages to cooling specimens during examination in the transmission electron microscope (TEM). These include reduced contamination, reduced mass loss and the minimization of diffusion of loosely bound ions. Smaller thermal diffuse scatter improves the contrast of diffraction patterns and cathodoluminescence is more easily observed. Cooling the specimen also allows the study of temperature dependent phenomena such as phase changes and superconductivity. A variant of standard specimen cooling holders, the cryotransfer holder, is important for the study of frozen biological tissue. Consequently, a high proportion of electron microscopists now routinely examine specimens in a cooling holder.

The design requirements of high image resolution and low minimum temperature ($T_{min}$) are in conflict. A low $T_{min}$ necessitates good thermal insulation while high image resolution requires mechanical constraints to minimize specimen vibration. An image resolution of the order of 0.2 nm if not unusual for modern TEMs and thus a horizontal vibration (i.e. perpendicular to the optical axis) of as little as 0.1 nm would be unacceptable. Vertical motion (i.e. in the direction of the microscope's optical axis) is less important to control since in a typical TEM the depth of field is perhaps 500 nm while high resolution imaging implies specimen thicknesses of less than 100 nm. Thus even a vertical motion as large as, say 10 nm, would not affect the image.

Movement in the direction of the long axis of the specimen rod is damped effectively by its bearing against the TEM stage. However, vibration perpendicular to both the specimen rod axis and the optical axis can only be damped by clamping the conductor, thereby leading to problems of adequate thermal insulation.

A known specimen cooling holder, designed and manufactured by Gatan Inc., comprises a strong, rigid outer barrel, a cryogen dewar and a conductor mounted within the outer barrel. The tip of the conductor contains a specimen cradle and a low thermal conductivity bearing to the TEM stage (U.S. Pat. No. 4,703,181). The TEM stage clamps the outer tube while the tip of the conductor is firmly attached to the outer barrel by a low thermal conductivity plastic tube. A harness, composed of a number of copper ribbons, connects the other end of the conductor to either side of the dewar inner wall, providing a flexible but conductive connection.

Problems with this design include some remaining transmission of vibration through the harness, particularly at low temperatures and local boiling of the cryogen at "hot spots", created at the join between the harness and the sides of the dewar. Further, the plastic tube connecting the tip of the conductor to the outer barrel provides inadequate thermal isolation, limiting $T_{min}$ to $\sim -165°$ C. In an earlier design, a thin walled stainless steel tube provide better thermal insulation but lacked rigidity, limiting resolution to $\sim 0.9$ nm.

The known cooling holder has a low power heater in a slot along the length of the conductor. This heater with the appropriate electronics allows the temperature of the specimen to be set between $T_{min}$ and some higher temperature, typically 90° C. The heater is also used to return the holder to room temperature once the experiment is complete and for baking the dewar vacuum during evacuation to improve thermal insulation. The positioning and power requirements which make the heater ideal for specimen temperature control make it ineffective for baking.

OBJECTS AND ADVANTAGES

Accordingly several objects and advantages of this invention are: to provide a side entry specimen cooling holder for transmission electron microscopy which provides better image resolution and has a lower minimum temperature than has heretofore been possible; to make these improvements apply over a range of tilt angles; and in which the dewar may be baked effectively during evacuation.

DRAWING FIGURES

Figure 1:
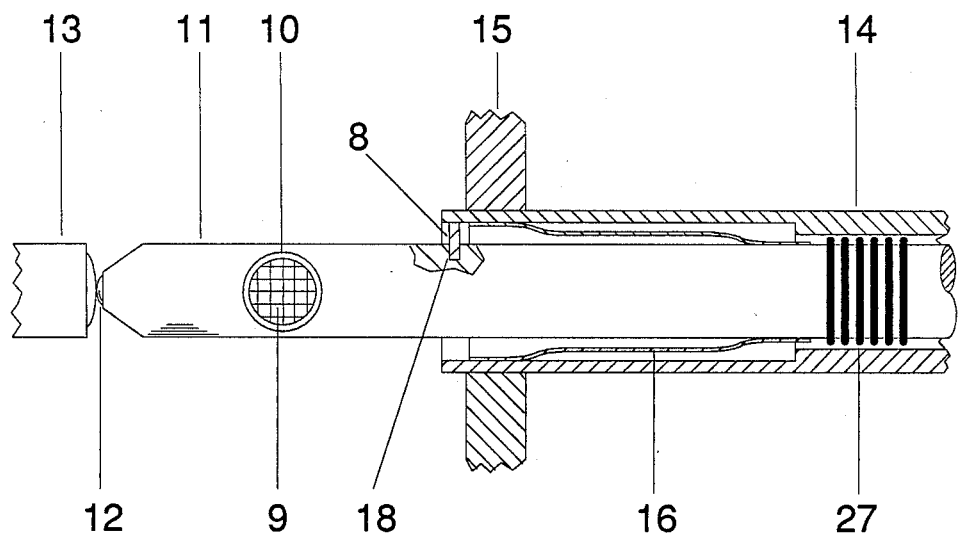
FIG. 1 is a horizontal section through the tip of the first embodiment of the invention.

| Drawing Reference Numerals | |
|---|---|
| 8 first low thermal conductivity pin | 18 recess |
| 9 specimen | 19 third low thermal conductivity pin |
| 10 recess in conductor tip | 20 fourth low thermal conductivity pin |
| 11 conductor | 21 fifth low thermal conductivity pin |
| 12 bearing | 22 harness |
| 13 microscope stage bearing | 23 inner cryogen vessel |
| 14 outer rigid tube | 24 outer vessel |
| 15 microscope stage | 27 first heater |
| 16 thin-walled tube | 29 second heater |
| 17 second low thermal conductivity pin | 30 ring |
| | 31 brazing points |

DESCRIPTION

FIG. 1, the first embodiment, shows the tip of the invention. Specimen 9 locates in recess 10 in the tip of conductor 11. Heat is removed from specimen 9 along conductor 11 to a cryogen reservoir (see FIG. 3). Low thermal conductivity bearing 12, fabricated from, for example, silica (see U.S. Pat. No. 4,703,181), insulates the tip of conductor 11 from microscope stage bearing 13. Conductor 11 is mounted within rigid outer tube 14. Microscope stage 15 firmly clamps rigid outer tube 14. Conductor 11 is joined to rigid outer tube 14 by thin-walled tube 16, fabricated from a low thermal conductivity stainless steel, thereby making a vacuum tight, low thermal conductivity connection. First low thermal conductivity pin 8, seating in recess 18 in conductor 11 is in the same plane as the specimen and is dimensioned to be just longer than the space available. The horizontal bending moment thus created in conductor 11 strongly damps motion perpendicular to the axis of the specimen rod and to the optic axis, thereby minimizing the most troublesome vibration and providing a significant improvement in attainable image resolution.

Figure 2:
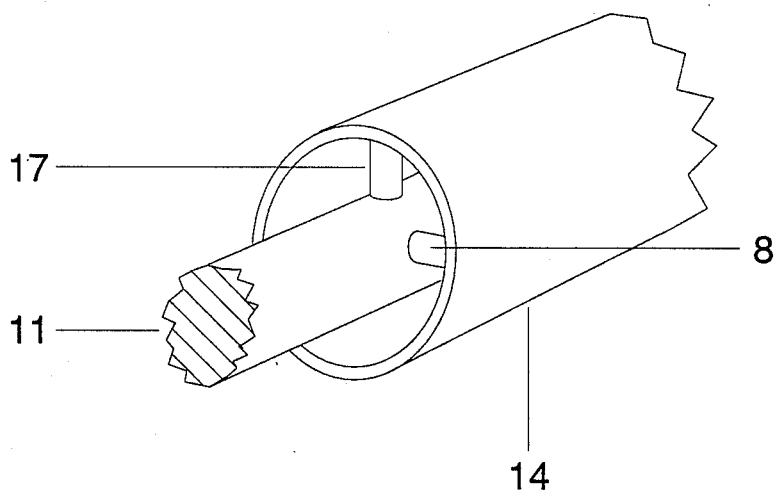
FIG. 2 is a view of part of the tip of a second embodiment of the invention.

FIG. 2 illustrates a second embodiment of the invention. The first embodiment of the invention is very effective when the specimen is horizontal. However, if the holder is tilted, first low thermal conductivity pin 8 is no longer perpendicular to the TEM's optic axis. The addition of second low thermal conductivity pin 17, also dimensioned to be just longer than the space available, provides sufficient additional damping so that at whatever angle the holder is tilted, significant improvements in image resolution are obtained. The addition of more pins, while improving resolution, leads to an unacceptable reduction in thermal insulation.

It is often desirable to control the holder temperature and, when removing the holder from the TEM, the tip must be heated above the local dew point to prevent frosting which would lead to increased water ice contamination when the holder was next inserted in the TEM. Additionally, the complex design of the invention means that vacuum inside the cryogen dewar slowly deteriorates and must be periodically re-evacuated. The effectiveness of the procedure is greatly increased if the dewar assembly is baked during re-evacuation. In a previous, known design by Gatan a single heater was used for both heating the specimen tip and baking the dewar. In the present invention, two separate heaters are provided, each being optimized for the specific task intended. First heater 27 (FIG. 1) is positioned close to the specimen to provide efficient temperature control of the tip while second heater 29 (FIG. 3) is fixed to inner cryogen vessel 23 and is optimized for baking the dewar.

Figures 3, 4:
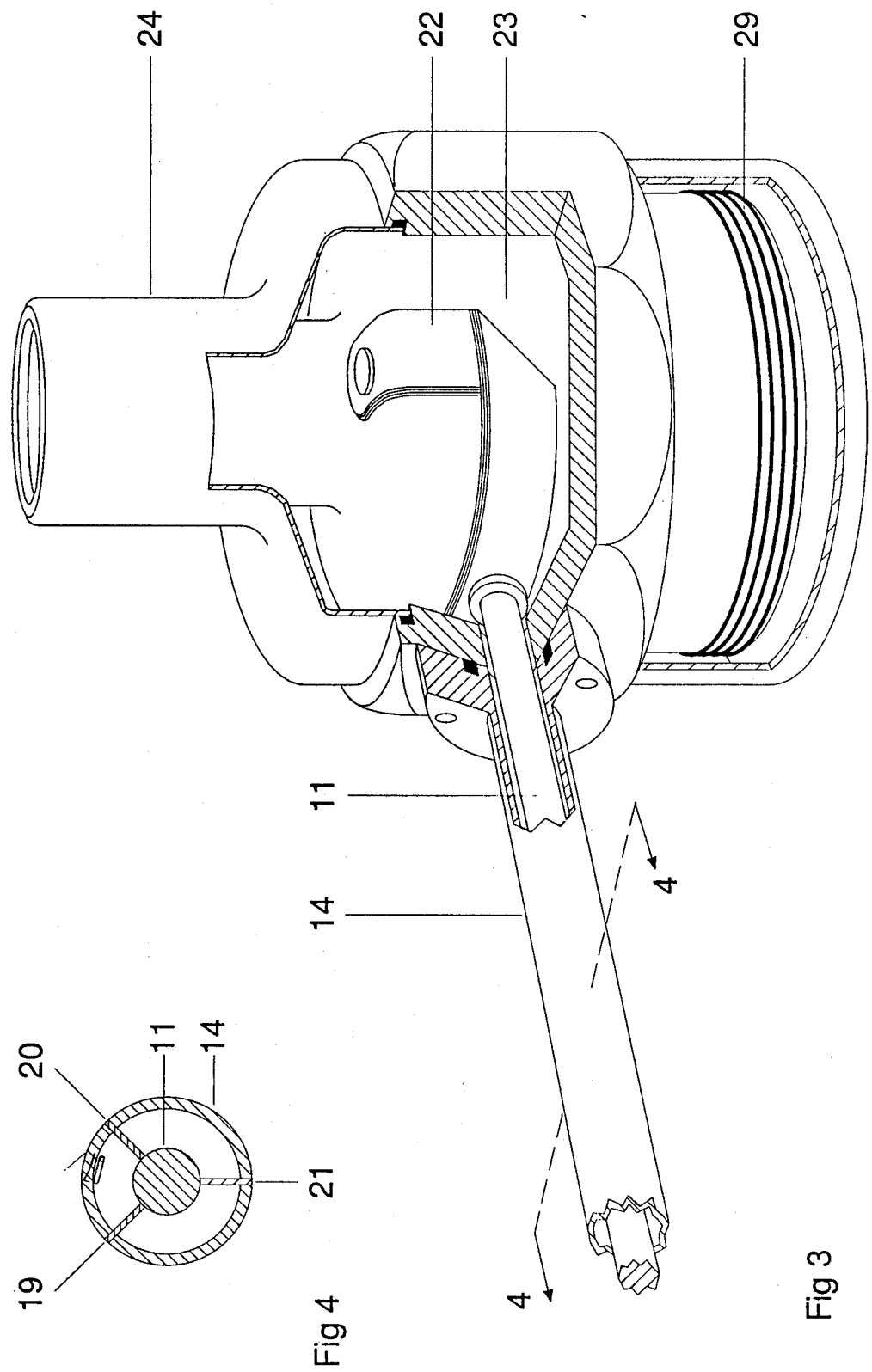
FIG. 3 shows the cryogen dewar, part of the conductor and the rigid outer barrel, the connection between the conductor and inner vessel of the dewar and the dewar heater.
FIG. 4 illustrates a method of mounting of the conductor inside the main barrel.
Figure 5:
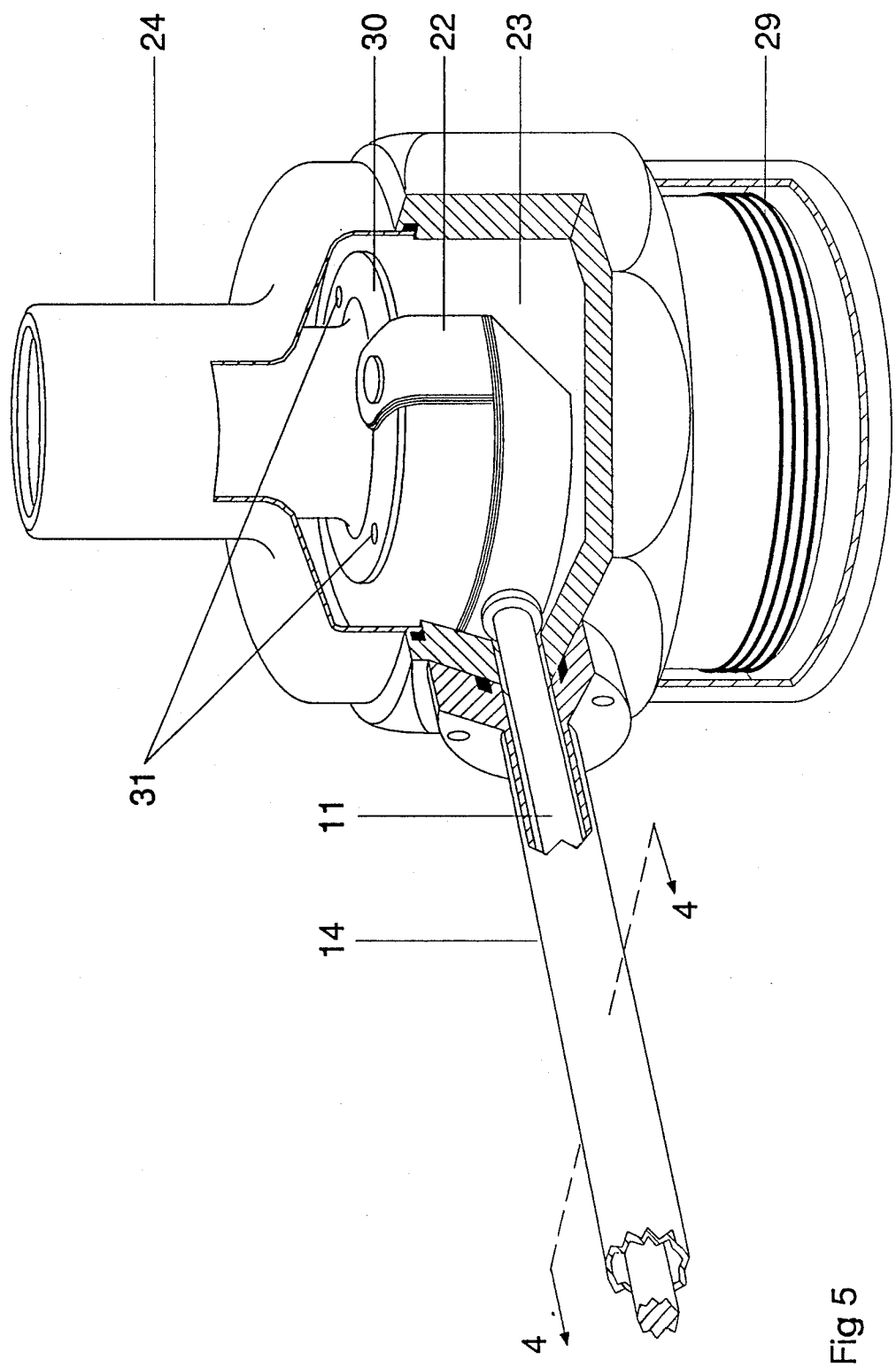
FIG. 5 shows a variation of the invention.

FIG. 3 illustrates the connection between the conductor and the dewar. Conductor 11 connects to harness 22 which in turn connects to inner cryogen vessel 23. Conductor 11 is held inside outer rigid tube 14 by third, fourth and fifth low thermal conductivity pins 19, 20 and 21 (see FIG. 4). Inner cryogen vessel 23 is insulated by evacuating the volume between it and outer vessel 24. Harness 22 comprises a number of thin, high thermal conductivity copper ribbons, joined at the middle and each end; conductor 11 connects to the middle join. The harness loops circumferentially around inner cryogen vessel 23; about ⅜ of the way bretween the middle join and each end join, the harness is folded over on itself to create a 90° bend and is then connected to the top of inner cryogen vessel 23. This moves the "hot spots" created at the join above the level of the cryogen, thereby preventing localized boiling and reducing vibration without significantly affecting $T_{min}$. However, if the holder is tilted, it is still possible that the cryogen will contact the "hot spots". This problem is minimized (see FIG. 5) by connecting harness 22 to ring 30 which in turn connects at brazing points 31 to a diameter of inner cryogen vessel 23, the diameter being parallel with the long axis of conductor 11, normally the main tilt axis of the holder. In this variation, even with the dewar filled with cryogen and at relatively high tilt angles, the cryogen will not contact the "hot spots".

In a previous known design, there is no 90° bend in harness 22 and the end joins were attached to the sides of inner cryogen vessel 23. The present invention ensures good thermal conductivity and provides significantly increased flexibility, particularly at low temperatures, thereby minimizing transmission to the specimen of any vibrations from the cryogen vessel. These advantages also apply at all practical holder tilts.

While the above description contains many specificities, the reader should not construe these as limitations on the scope of the invention but merely as exemplifications of the preferred embodiments thereof. Those skilled in the art will envisage other possible variations within its scope. For example, harness 22 may be bent any number of times and in any direction to further improve flexibility and facilitate connection to the top of inner cryogen vessel 23.

What is claimed is:

1. A side-entry electron microscope spceimen-cooling holder including;
   (a) a conductor for removing heat from a specimen,
   (b) a dewar comprising an inner vessel and an outer vessel, and
   (c) a flexible, conductive harness connecting said conductor to the inner vessel of said dewar, said harness describing arcs in a plurality of planes,
   whereby at low temperatures said harness is sufficiently flexible that there is good mechanical isolation of said conductor from said dewar.

2. The device as claimed in claim 1 wherein the connections between said harness and the inner vessel of said dewar are above the long axis of said conductor whereby elevated temperature regions occurring at the connection between said harness and the inner vessel of said dewar are above the level of any cryogen within said dewar.

3. The device as claimed in claim 1 wherein the connections between said harness and the inner vessel of said dewar are along a horizontal diameter of the inner vessel of said dewar, said horizontal diameter being parallel with and above the long axis of said conductor whereby elevated temperature regions occurring at the connection between said harness and the inner vessel of said dewar are above the level of any cryogen within said dewar.

4. A side-entry electron microscope specimen-cooling holder including a conductor for removing heat from a specimen, a support barrel surrounding said conductor and means to damp vibration of said specimen, said means comprising a low thermal conductivity pin, one end of which touches said support barrel and the other end of which touches said conductor, said low thermal conductivity pin being close to said specimen and positioned to contain the specimen plane and of a length that induces a bending moment in said conductor, said bending moment being in the plane of said specimen, whereby vibrations in the plane of said specimen are strongly damped.

5. The device as claimed in claim 4 further including a second low thermal conductivity pin, one end of which touches said support barrel and the other end of which touches said conductor, said second low thermal conductivity pin being close to said specimen and positioned perpendicular to the specimen plane and of a length that induces a bending moment in said conductor whereby in combination with the first low conductivity pin vibrations of said specimen perpendicular to the long axis of said conductor are strongly damped.

6. A side-entry electron microscope specimen-cooling holder including;
(a) a conductor for removing heat from a specimen,
(b) a dewar comprising an inner vessel and an outer vessel,
(c) a first heater in close contact with said conductor and proximal to said specimen, and
(d) a second heater in close contact with said inner vessel whereby control of specimen temperature and baking of said dewar during evacuation are both optimized.

* * * * *